(12) United States Patent
Maruyama et al.

(10) Patent No.: US 10,847,205 B2
(45) Date of Patent: Nov. 24, 2020

(54) MEMORY SYSTEM

(71) Applicant: TOSHIBA MEMORY CORPORATION, Minato-ku, Tokyo (JP)

(72) Inventors: Yohei Maruyama, Kamakura Kanagawa (JP); Katsuya Ohno, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/553,768

(22) Filed: Aug. 28, 2019

(65) Prior Publication Data

US 2020/0286547 A1   Sep. 10, 2020

(30) Foreign Application Priority Data

Mar. 6, 2019  (JP) ................. 2019-040499

(51) Int. Cl.
| | |
|---|---|
| *G11C 11/40* | (2006.01) |
| *G11C 11/406* | (2006.01) |
| *G11C 11/4091* | (2006.01) |
| *G11C 29/52* | (2006.01) |
| *G06F 13/16* | (2006.01) |
| *G11C 7/04* | (2006.01) |

(52) U.S. Cl.
CPC .... *G11C 11/40626* (2013.01); *G06F 13/1668* (2013.01); *G11C 7/04* (2013.01); *G11C 11/4091* (2013.01); *G11C 29/52* (2013.01)

(58) Field of Classification Search
CPC .......................... G11C 11/40626; G11C 7/04
See application file for complete search history.

(56) References Cited

U.S. PATENT DOCUMENTS

| | | | |
|---|---|---|---|
| 8,873,323 B2 | 10/2014 | Li | |
| 9,201,717 B2 | 12/2015 | Yano | |
| 2011/0205826 A1* | 8/2011 | Kuroda | ............. G11C 11/40626 365/222 |
| 2015/0301744 A1* | 10/2015 | Kim | ...................... G06F 3/0634 711/103 |
| 2015/0301932 A1 | 10/2015 | Oh | |
| 2015/0373876 A1* | 12/2015 | Berke | .................... G05B 15/02 700/282 |
| 2018/0293029 A1* | 10/2018 | Achtenberg | ........... G11C 16/26 |
| 2019/0043559 A1* | 2/2019 | McVay | ................... G06F 1/206 |

* cited by examiner

*Primary Examiner* — Han Yang
(74) *Attorney, Agent, or Firm* — Foley & Lardner LLP

(57) ABSTRACT

A memory system includes a first memory chip that includes a first temperature sensor, and a memory controller that includes a second temperature sensor. The memory controller is configured to: perform, at a first timing, a first temperature acquisition process including acquiring a first measured temperature using the first temperature sensor or the second temperature sensor; select one of the first temperature sensor and the second temperature sensor for a second temperature acquisition process based the first measured temperature; and perform, at a second timing later than the first timing, the second temperature acquisition process including acquiring a second measured temperature using the selected one of the first temperature sensor or the second temperature sensor.

15 Claims, 8 Drawing Sheets

US 10,847,205 B2

MEMORY SYSTEM

CROSS-REFERENCE TO RELATED APPLICATION

This application claims the benefit of and priority to Japanese Patent Application No. 2019-040499, filed Mar. 6, 2019, the entire contents of which are incorporated herein by reference.

FIELD

Embodiments described herein generally relate to a memory system.

BACKGROUND

Some comparative embodiments include a memory system that includes a memory chip of non-volatile memory. In the memory chip, a temperature range is defined, in which the memory chip can operate correctly. The memory system controls a performance of the memory system such that the temperature of the memory chip does not exceed an upper limit value of the above-described temperature range. For example, if the temperature of the memory chip is likely to exceed the upper limit value, the memory system reduces heat generation of the memory chip by reducing its performance.

DETAILED DESCRIPTION

Embodiments described herein provide for a memory system that can efficiently control performance.

In general, according to one embodiment, a memory system includes a first memory chip that includes a first temperature sensor, and a memory controller that includes a second temperature sensor. The memory controller is configured to: perform, at a first timing, a first temperature acquisition process including acquiring a first measured temperature using the first temperature sensor or the second temperature sensor; select one of the first temperature sensor and the second temperature sensor for a second temperature acquisition process based the first measured temperature; and perform, at a second timing later than the first timing, the second temperature acquisition process including acquiring a second measured temperature using the selected one of the first temperature sensor or the second temperature sensor.

Hereinafter, a memory system according to embodiments will be described in detail with reference to the drawings. The present disclosure is not limited by these embodiments.

First Embodiment

Figure 1:
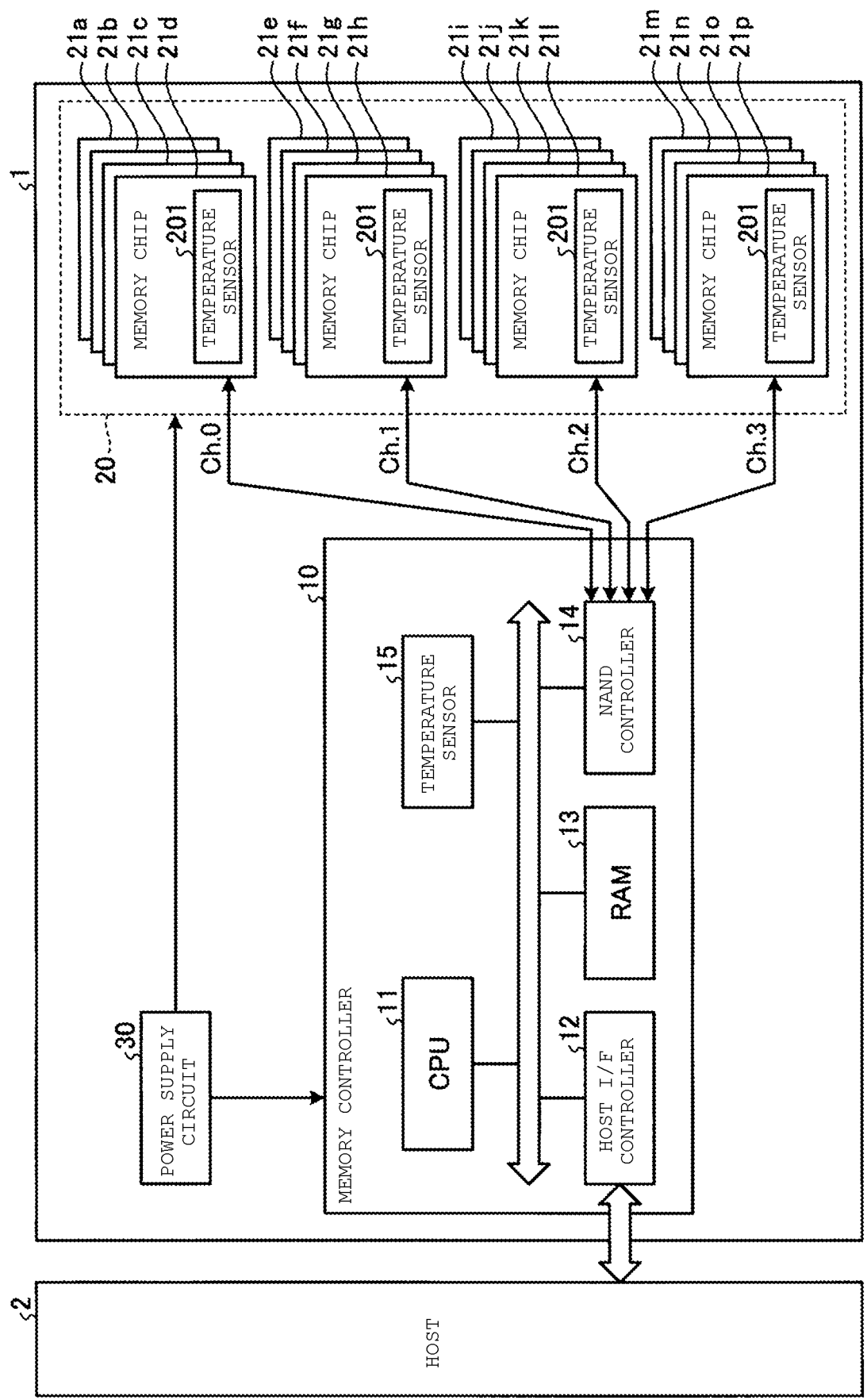
FIG. 1 is a diagram illustrating a configuration of a memory system according to a first embodiment.

FIG. 1 is a diagram illustrating a configuration of a memory system according to a first embodiment. As depicted, a memory system 1 is connectable to a host 2. The standard of a communication path between the memory system 1 and the host 2 is not limited to a specific standard. As an example, SAS (Serial Attached SCSI) may be employed.

The host 2 is, for example, a personal computer, a portable information terminal, or a server. The memory system 1 receives an access command (a read command and/or a write command) from the host 2.

The memory system 1 includes a memory controller 10, a NAND type flash memory (a NAND memory) 20, and a power supply circuit 30.

The NAND memory 20 includes one or more memory chips 21. Here, the NAND memory 20 includes 16 memory chips 21a to 21p as the one or more memory chips 21. Hereinafter, each of the 16 memory chips 21a to 21p may be referred to as a memory chip 21.

The 16 memory chips 21 configuring the NAND memory 20 are connected to the memory controller 10 via four channels (ch. 0 to ch. 3). According to the example in FIG. 1, the memory chips 21a to 21d are connected to the channel (ch. 0). The memory chips 21e to 21h are connected to the channel 1 (ch. 1). The memory chips 21i to 21l are connected to the channel 2 (ch. 2). The memory chips 21m to 21p are connected to the channel 3 (ch. 3).

Each channel is configured with a wiring group including an I/O signal line and a control signal line. The I/O signal line is, for example, a signal line for transmitting and receiving data, an address, and/or a command. The control signal line is, for example, a signal line for transmitting and receiving a write enable (WE) signal, a read enable (RE) signal, a command latch enable (CLE) signal, an address latch enable (ALE) signal, a write protect (WP) signal, and the like.

The memory controller 10 can control each channel individually. The memory controller 10 may simultaneously operate a total of four memory chips 21 that are connected to different channels respectively, by controlling four channels simultaneously.

The number of channels in the memory system 1 is not limited to four. The number of memory chips 21 connected to each channel is not limited to four respectively. The number of memory chips 21 configuring the NAND memory 20 is not limited to sixteen.

The power supply circuit 30 generates power for driving the memory controller 10 and the NAND memory 20, and supplies the generated power to each of the memory controller 10 and the NAND memory 20.

The memory controller 10 has components that cooperate to control the whole of the memory system 1.

The memory controller 10 performs data transfer between the host 2 and the NAND memory 20. When a read command is received from the host 2, the memory controller 10 reads data from the memory chip 21 that stores the data requested by the read command. Then, the memory controller 10 transmits the read data to the host 2. When a write command is received from the host 2, the memory controller determines the memory chip 21 which is a write destination of data requested by the write command, and writes the data into the determined memory chip 21.

Here, each memory chip 21 has a temperature range for operating correctly (e.g. according to specifications). This temperature range is referred to as a guaranteed range of operation temperature. The memory controller 10 may be configured to attempt to control the performance of the memory system 1 such that none of the memory chips 21 exceed the upper limit of the guaranteed range of operation temperature.

As the frequency of access to the memory chip 21 increases, the amount of power consumption of the memory chip 21 increases, and thus, the amount of heat generation of the memory chip 21 increases. That is, the amount of heat generation of the memory chip 21 corresponds to the frequency of access to the memory chip 21. Furthermore, the frequency of access to the memory chip 21 corresponds to a data transfer rate (rate of transferring data) between the host 2 and the memory system 1.

Here, as an example, the memory system 1 controls the data transfer rate between the host 2 and the memory system 1. That is, at least one of the performances or operations to be controlled (with respect to managing a temperature of the memory chip 21) is the data transfer rate between the host 2 and the memory system 1 (hereinafter, the data transfer rate means a data transfer rate between the host 2 and the memory system 1 unless otherwise noted). As used herein, reference to a "performance" of the memory system 1 may refer to any appropriate metric or capability of the memory system 1, including the data transfer rate described above. Reference to a "higher" or "lower" performance or performance level may refer to a higher or lower value for the metric, or to a higher or lower capability (e.g., a higher or lower data transfer rate).

The control method of the data transfer rate is not limited to a specific method. For example, the memory controller 10 may control the data transfer rate by adjusting the timing of transmission of a response to an access command from the host 2. In another example, the memory controller 10 may control the data transfer rate by adjusting read and write execution intervals for each memory chip 21. In still another example, the memory controller 10 may control the data transfer rate by adjusting a clock frequency that drives the NAND memory 20 or the memory controller 10 itself.

The memory controller 10 sets an upper limit value to its performance. That is, the memory controller 10 performs a data transfer between the host 2 and the memory system 1 such that the data transfer rate does not exceed the upper limit value. Then, the memory controller measures the temperature using a temperature sensor provided in the memory system 1, and sets the upper limit value according to the measured temperature.

Figure 2:
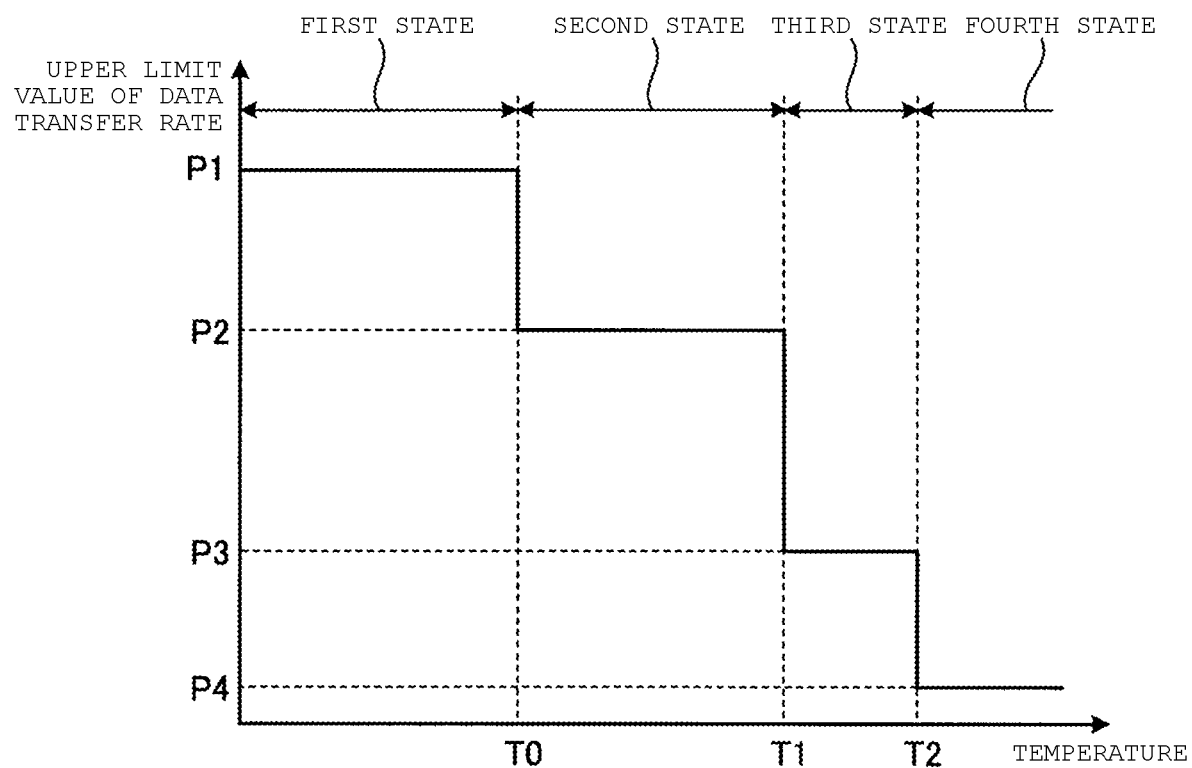
FIG. 2 is a diagram for illustrating an example of a method of setting an upper limit value of a data transfer rate according to the first embodiment.

FIG. 2 is a diagram for illustrating an example of a method of setting the upper limit value of the data transfer rate according to the first embodiment. In the diagram, the horizontal axis represents the measured temperature, and the vertical axis represents the upper limit value of the data transfer rate.

According to the example in FIG. 2, four states are defined in accordance with the temperature. The four states include a first state corresponding to the temperature range lower than a threshold value T0, a second state corresponding to the temperature range from the threshold value T0 to a threshold value T1, a third state corresponding to the temperature range from the threshold value T1 to a threshold value T2, and a fourth state corresponding to the temperature range higher than the threshold value T2.

Each state is associated with an upper limit value relating to the data transfer rate. Specifically, P1 is associated as the upper limit value with the first state, P2 is associated as the upper limit value with the second state, P3 is associated as the upper limit value with the third state, and P4 is associated as the upper limit value with the fourth state. P1 to P4 satisfy the relationship of P1>P2>P3>P4. That is, according to this example, in the memory system 1, the upper limit value of the data transfer rate is lowered in step wise fashion in accordance with the increase in temperature.

P1 may be set to a value equal to or larger than the maximum value of the data transfer rate achievable in the memory system (e.g. according to specifications of the memory system). In this case, the memory system 1 can operate at its maximum performance in the first state.

The temperature T2 corresponds to the upper limit value of the guaranteed range of operation temperature. Accordingly, a relatively small value (e.g., a value one tenth that of P1 or less, a value one one-hundredth that of P1 or less, a value one one-thousandth that of P1 or less, or approximately zero) is set as P4 such that the amount of heat generation is approximately zero. That is, in the fourth state, the host 2 can hardly transmit and receive data to and from the memory system 1.

The memory system 1 includes two types of temperature sensors for measuring the temperature. One of the two types of temperature sensors is the temperature sensor provided in the memory controller 10 (temperature sensor 15 illustrated in FIG. 1). Another type of the two types of temperature sensors is a temperature sensor provided in the memory chip 21 (temperature sensor 201 illustrated in FIG. 1 and FIG. 3).

The temperature sensor 201 provided in the memory chip 21 can measure correct temperature of the memory chip 21. However, in order for the memory controller 10 to acquire the measured temperature using the temperature sensor 201, processes may be implemented that interrupt a write or read access to the memory chip 21 and transmit a command to the memory chip 21 to acquire the measured temperature. Therefore, when using the temperature sensor 201, it is possible to obtain the correct temperature of the memory chip 21, but the access to the memory chip 21 might be often interrupted, so that the data transfer rate between the host 2 and the memory system 1 might slightly decrease. The command for acquiring the measured temperature is referred to as a temperature acquisition command.

In contrast, when using the temperature sensor 15 provided in the memory controller 10, an access to the memory chip 21 is not required. Accordingly, the measured temperature can be acquired without sacrificing the data transfer rate. However, since the temperature sensor 15 is provided at a position separated from the memory chip 21, the temperature measurement of the memory chip 21 might be less accurate. The correspondence relationship between temperature measured by the temperature sensor 15 and the temperature of memory chip 21 may vary depending on various factors such as a positional relationship between the memory chip 21 and the memory controller 10, the temperature of the environment where the memory system 1 is placed, or a positional relationship between the memory system 1 and a heating element such as a power supply unit provided outside the memory system 1.

Since the correspondence relationship between the temperature measured by the temperature sensor 15 and the temperature of the memory chip 21 varies, if the performance is controlled on the basis of the temperature sensor 15, preparing for a case in which the temperature measured by the temperature sensor 15 is less than the actual temperature of the memory chip 21, a margin between the upper limit value of the guaranteed range of operation temperature and the threshold value T2 (which is the boundary of a state transition) can be provided. Therefore, if the situation does not fall under such a case, an unnecessary reduction occurs in the performance.

For example, considering the case where the upper limit value of the guaranteed range of operating temperature of the memory chip 21 is 85° C. A manufacturer determines the relationship between the temperature measured by the temperature sensor 15 and the temperature of the memory chip 21 under various use conditions through experiment or calculation. If it is found that the temperature measured by the temperature sensor 15 varies from 81° C. to 84° C. depending on the use conditions when the temperature of the memory chip 21 is 85° C., the manufacturer may set 81° C. as the threshold value T2, which is the lowest value of the range of variation of the temperature measured by the temperature sensor 15. In this way, it is possible to control the performance such that the temperature of the memory chip 21 does not exceed 85° C. even in the worst case.

However, in a not worst case, for example, even if the upper limit value is maintained at P3 until the temperature measured by the temperature sensor 15 reaches 84° C., the temperature of memory chip 21 can be within the guaranteed range of operation temperature. In such a case, the performance will be reduced even when the temperature measured by the temperature sensor 15 is lower than 84° C., which means that the performance is excessively reduced.

According to the first embodiment, in order to control the performance more efficiently, the memory controller 10 determines whether to use the temperature sensor 15 in the memory controller 10 or the temperature sensor 201 in the memory chip 21, based on the measured temperature.

If the temperature of the memory chip 21 is sufficiently lower than the upper limit value of the guaranteed range of operation temperature, it may be acceptable for the measured temperature to be somewhat inaccurate. Thus, for example, if the acquired measured temperature is lower than the threshold value T1, that is, when the state of temperature control is the first state or the second state, the memory controller 10 determines to use the temperature sensor 15 in the memory controller 10 for acquiring the next measured temperature. When using the temperature sensor 15, since it is not necessary to transmit the temperature acquisition command to the memory chip 21 for acquiring the measured temperature (which may involve interruption of certain processes), high-speed data transfer can be achieved.

If the temperature of the memory chip 21 is in the vicinity of the upper limit value of the guaranteed range of operation temperature, the data transfer rate is already reduced by suppressing the performance (e.g. the data transfer rate is already made low). Compared to the decrease in data transfer rate due to the suppression of the performance, a decrease in data transfer rate due to acquisition of the measured temperature from the memory chip 21 may be small. Thus, for example, when the acquired measured temperature is higher than the threshold value T1, that is, when the state of temperature control is the third state or the fourth state, the memory controller 10 determines to use the temperature sensor 201 provided in the memory chip 21 for acquiring of a next measured temperature. In this way, an unnecessary reduction in performance can be prevented when the temperature is in the first state or the second state.

By selecting the temperature sensor in accordance with the measured temperature as described above, it is possible to expect an improvement in the average of the data transfer rate. That is, the efficient control of the performance is achieved.

Figure 3:
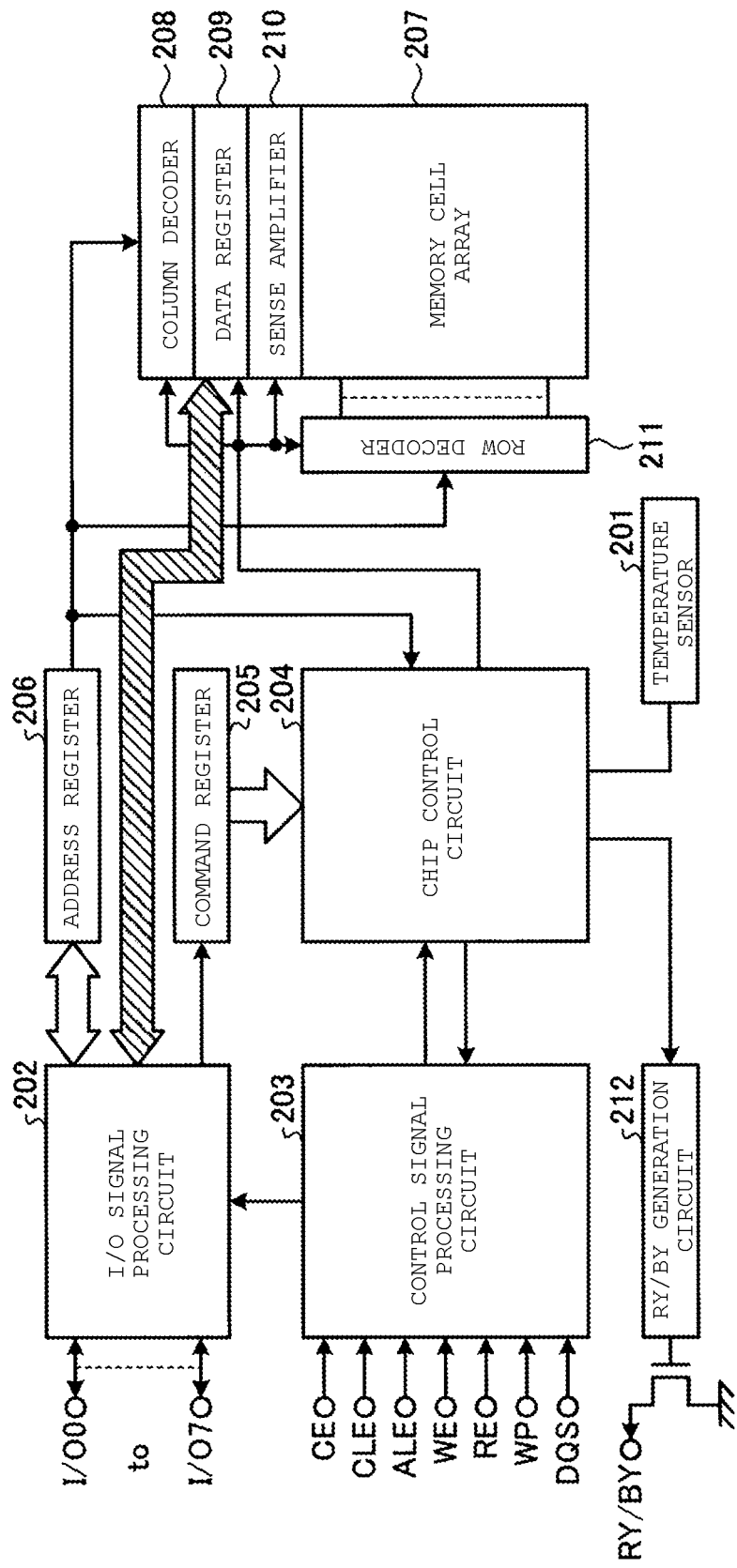
FIG. 3 is an exemplary and schematic block diagram for illustrating a configuration of each memory chip according to the first embodiment.

FIG. 3 is an exemplary and schematic block diagram illustrating the configuration of each memory chip 21 according to the first embodiment.

The memory chip 21 includes the temperature sensor 201, an I/O signal processing circuit 202, a control signal processing circuit 203, a chip control circuit 204, a command register 205, an address register 206, a memory cell array 207, a column decoder 208, a data register 209, a sense amplifier 210, a row decoder 211, and a RY/BY generation circuit 212.

The control signal processing circuit 203 receives various control signals, and, based on the received control signals, distributes an I/O signal, which is received by the I/O signal processing circuit 202, to proper registers. In addition, the control signal processing circuit 203 transfers the received control signal to the chip control circuit 204.

The chip control circuit 204 is a state transition circuit (state machine) that makes state transition based on the various control signals received via the control signal processing circuit 203. The chip control circuit 204 performs overall control of the operation of the memory chip 21 based on the various control signals.

The I/O signal processing circuit 202 is a buffer circuit for transmitting and receiving I/O signals to and from the memory controller 10 via the I/O signal line. A command, an address (physical address) and data (write data) received by the I/O signal processing circuit 202 as the I/O signal are distributed to the command register 205, the address register 206, and the data register 209, respectively.

The temperature sensor 201 is a sensor that detects temperature. If a temperature acquisition command is stored in the command register 205, the chip control circuit 204 acquires an output of the temperature sensor 201 as a measured temperature. The measured temperature is sent to the I/O signal processing circuit 202 and output from the I/O signal processing circuit 202 to the memory controller 10.

The address stored in the address register 206 includes a row address and a column address. The row address is read out to the row decoder 211, and the column address is read out to the column decoder 208, respectively.

The memory cell array 207 includes a plurality of memory cells. The memory cell array 207 stores the write data received from the host 2.

The memory cell array 207 includes a plurality of blocks. All data stored in one block is erased at one time. Each block includes a plurality of pages. The data writing and the data reading to and from the memory cell array 207 are performed on a page basis. That is, access to the memory chip 21 is performed on a page basis.

The row decoder 211, the column decoder 208, and the sense amplifier 210 perform access to the memory cell array 207 based on the control by the chip control circuit 204. Specifically, at the time of data writing, the row decoder 211 selects a word line corresponding to the row address and activates the selected word line. The column decoder 208 selects and activates a bit line corresponding to the column address. The sense amplifier 210 applies a voltage to the bit line selected by the column decoder 208 to write data stored in the data register 209 into a target memory cell located at the intersection of the word line selected by the row decoder 211 and the bit line selected by the column decoder 208.

In addition, at the time of data reading, the row decoder 211 applies more than one read levels to the word line corresponding to the row address. The sense amplifier 210 senses whether the target memory cell is conductive or nonconductive for each read level applied by the row decoder 211 to the word line, determines data stored in the target memory cell based on the result of sensing for each read level, and stores the data obtained by the determination in the data register 209. The data stored in the data register 209 is sent to the I/O signal processing circuit 202 through data lines, and transferred to the memory controller 10 from the I/O signal processing circuit 202.

The RY/BY generation circuit 212 transitions the state of the RY/BY signal line between a ready state (RY) and a busy state (BY) under the control of the chip control circuit 204.

The description will be returned to FIG. 1.

The memory controller 10 includes a central processing unit (CPU) 11, a host interface controller (host I/F controller) 12, a random access memory (RAM) 13, a NAND controller 14, and the temperature sensor 15.

The RAM 13 is a memory that functions as a cache, a buffer, and a working area. For example, the RAM 13 is configured with a dynamic random access memory (DRAM), a static random access memory (SRAM), or a combination thereof. The RAM 13 may be disposed outside the memory controller 10.

The host interface controller 12 controls transmission and reception of information (a command, data) between the host 2 and the memory controller 10. For example, the host interface controller 12 writes data received from the host 2 into the RAM 13 or transmits data, which is read from the NAND memory 20 and stored in the RAM 13 by the NAND controller 14, to the host 2.

The NAND controller 14 accesses the NAND memory 20 under the control of the CPU 11. For example, the NAND controller 14 writes data stored in the RAM 13 into the NAND memory 20, reads data stored in the NAND memory 20 and writes the read data into the RAM 13.

The CPU 11 is a processor that operates based on a program (e.g. a firmware program) built in the memory system 1. The firmware program is stored, for example, in a predetermined position in the NAND memory 20. The CPU 11 loads the firmware program from the NAND memory 20 to the RAM 13 at startup of the memory system 1. Then, the CPU 11 executes the firmware program loaded to the RAM 13.

The temperature sensor 15 is a sensor that measures temperature. The output from the temperature sensor 15 is acquired by the CPU 11 as a measured temperature.

The CPU 11 performs various functions of the memory controller 10 according to the firmware program, including the control of the performance described above.

Some or all of the functions of the host I/F controller 12 and the NAND controller 14 may be performed by the CPU 11. In addition, some or all of the functions of the CPU 11 may be realized by a hardware circuit that does not involve a computer program, such as a field-programmable gate array (FPGA) or an application specific integrated circuit (ASIC). That is, the memory controller may be implemented by hardware, software, or a combination thereof. The memory controller 10 may be configured as a system-on-a-chip (SoC). The memory controller 10 may be configured with a plurality of chips.

Figure 4:
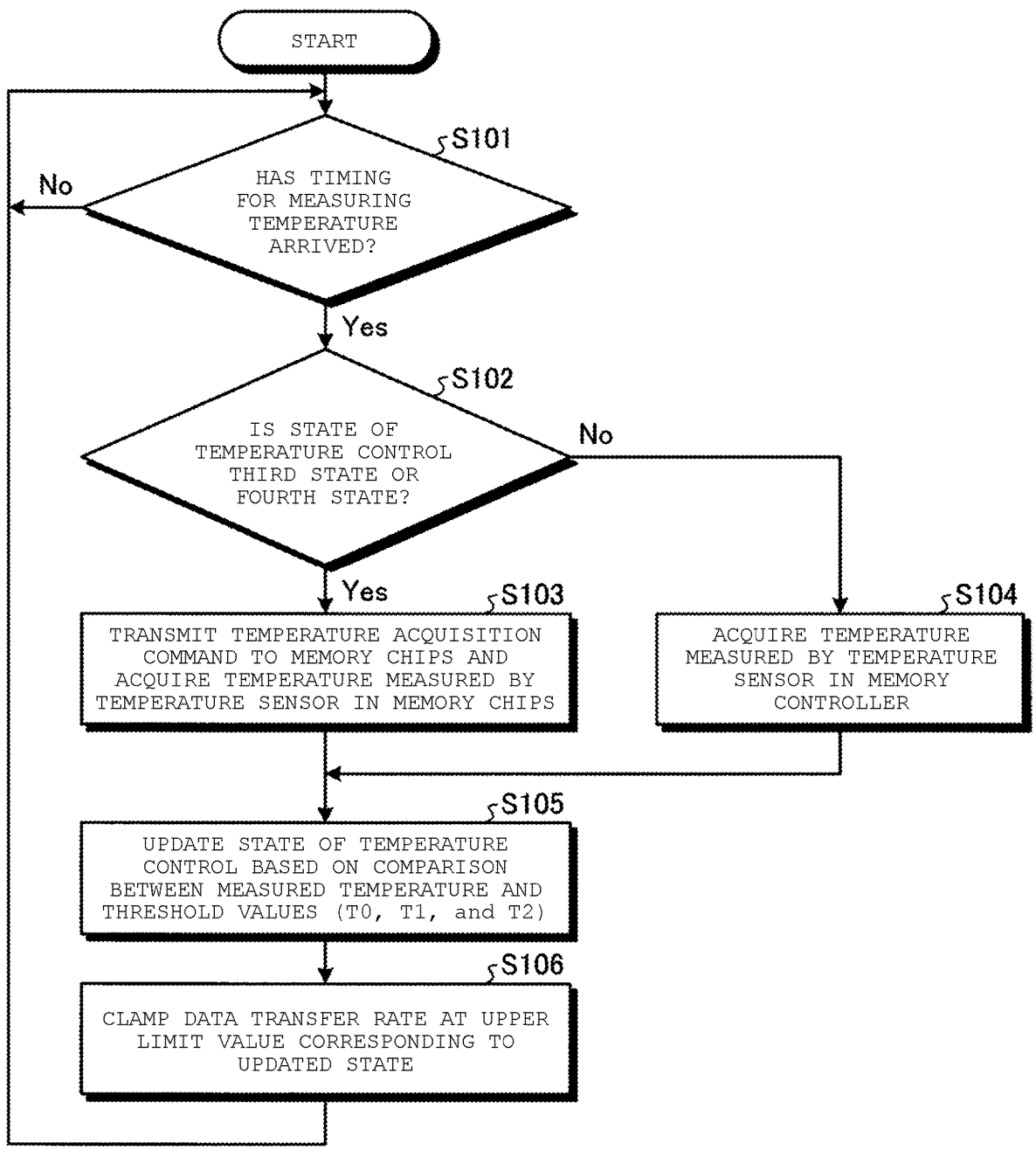
FIG. 4 is a flow chart illustrating an example of the operation of the memory system according to the first embodiment.

FIG. 4 is a flowchart illustrating an example of the operation of the memory system 1 according to the first embodiment.

First, the CPU 11 determines whether or not the timing for measuring the temperature has arrived (e.g. whether it is time to measure the temperature) (S101). The timing for measuring the temperature is set as desired. For example, the timing for measuring the temperature is set as a predetermined cycle, such as every second. The CPU 11 may determine the timing for measuring the temperature based on a count signal from a hardware counter (not illustrated).

If the timing for measuring the temperature has not arrived (No in S101), the determination processing S101 is performed again. If the timing for measuring the temperature has arrived (Yes in S101), the CPU 11 determines whether or not the current state of temperature control is one of a set of states in which temperature is to be measured by the temperature sensor 201 in a memory chip 21 (e.g. a state in which accurate temperature measurement of the NAND memory 20 is prioritized, such as the third state or the fourth state in the first embodiment) (S102).

When the current state is the third state or the fourth state (Yes in S102), the CPU 11 acquires the temperature measured by the temperature sensor 201 in one or more memory chips 21 (S103). In S103, by transmitting a temperature acquisition command via the NAND controller 14 to one or more memory chips 21, the CPU 11 causes each of the one or more memory chips 21 to output the temperature measured by the temperature sensor 201.

The one or more memory chips 21 which output the measured temperature is selected by any appropriate method. An example of a method of selecting the one or more memory chips 21 which outputs the measured temperature will be described according to a second embodiment.

When the current state is one of a set of states in which the temperature is to be measured by the temperature sensor 15 in the memory controller 10 (e.g. a state in which refraining from sending a temperature acquisition command to the NAND memory 20 is prioritized, such as the first state or the second state in the first embodiment) (No in S102), the CPU 11 acquires the temperature measured by the temperature sensor 15 in the memory controller 10 (S104).

After S103 or S104, the CPU 11 updates the state of temperature control based on the comparison between the measured temperature and the threshold values (T0, T1, and T2) (S105).

Specifically, if the measured temperature is lower than the threshold value T0, the CPU 11 causes the state of temperature control to transition from the current state to the first state. If the measured temperature is higher than the threshold value T0 and lower than the threshold value T1, the CPU 11 causes the state of temperature control to transition from the current state to the second state. If the measured temperature is higher than the threshold value T1 and lower than the threshold value T2, the CPU 11 causes the state of temperature control to transition from the current state to the third state. If the measured temperature is higher than the threshold value T2, the CPU 11 causes the state of temperature control to transition from the current state to the fourth state.

If the measured temperatures are acquired from a plurality of memory chips 21 in S103, the CPU 11 may acquire a value from the plurality of measured temperatures, which will be used for comparison with the threshold value. A method of acquiring the value used for the comparison is not limited to a specific method. For example, the CPU 11 may use the maximum value of the plurality of measured temperatures for the comparison in S105. In another example, the CPU 11 may use an average value of the plurality of measured temperatures for the comparison in S105. The CPU 11 may switch the method of acquiring the value from the plurality of measured temperatures in accordance with the state of temperature control (e.g. may use the maximum value of the plurality of measured temperatures for the comparison in S105 when the temperature control state is the third state or the fourth state).

If the measured temperature is equal to the threshold value, the CPU 11 may cause the state of temperature control to transition from the current state to the state of low temperature side of the two adjacent states divided by the threshold value, or to transition from the current state to the state of high temperature side of the two states.

If the state determined based on the comparison of the measured temperature and the threshold value (T0, T1, and T2) is the same as the current state, the CPU 11 may not perform the update of the state of temperature control.

After S105, the CPU 11 clamps the data transfer rate at the upper limit value corresponding to the current state (S106). Then, the processing S101 is performed again.

As described above, according to the first embodiment, the memory controller 10 acquires measured temperature from the temperature sensor 15 or the temperature sensor 201 in S103 or S104. Then, the memory controller 10 updates the state based on the comparison between the acquired measured temperature and the threshold values (T0, T1, and T2) (S105). Thereafter, the memory controller 10 determines which of the temperature sensor 15 or the temperature sensor 201 to acquire the temperature from, based on whether or not the current state is the third state or the fourth state (S102).

In other words, the memory controller 10 acquires the measured temperature from the temperature sensor 15 or the temperature sensor 201 at the timing (a first timing) of S103 or S104, and determines which of the temperature sensor 15 and the temperature sensor 201 to acquire a measured temperature at a second timing later than the first timing, based on the acquired measured temperature.

According to configuration, it is possible to transfer data at a high speed because of the temperature sensor 15 being used when temperature of the memory chip 21 is in a temperature region sufficiently lower than the upper limit value of the guaranteed range of operation temperature, and it is possible to prevent, by using the temperature sensor 201, an excessive reduction in the performance when temperature of the memory chip 21 is in a temperature region in the vicinity of the upper limit value of the guaranteed range of operation temperature. That is, an efficient control of the performance is achieved.

In addition, according to the first embodiment, the memory controller 10 performs the selection of the temperature sensor based on the comparison between the measured temperature and the threshold value T1 in S105 and S102 performed thereafter. Specifically, if the measured temperature is higher than the threshold value T1, the memory controller 10 determines to use the temperature sensor 201. If the measured temperature is lower than the threshold value T1, the memory controller 10 determines to use the temperature sensor 15.

In this way, the efficient control of the performance is also achieved.

In addition, according to the first embodiment, in S105 and S106, if the measured temperature is higher than the threshold value T2, the memory controller 10 makes the performance lower than that when the measured temperature is lower than the threshold value T2. The threshold value T2 corresponds to the vicinity of the upper limit value of the guaranteed range of operation temperature, and is larger than the threshold value T1.

In this way, the control of the performance in the vicinity of the upper limit value of the guaranteed range of operation temperature is performed based on the measured temperature indicating the temperature of the memory chip 21 accurately. As a result thereof, an excessive performance reduction in the vicinity of the upper limit value of the guaranteed range of operation temperature is prevented.

If the control of the performance in the vicinity of the upper limit value of the guaranteed range of operation temperature is performed solely based on the temperature measured by the temperature sensor 15, as described above in reference to certain comparative examples, it may be necessary to obtain a correspondence between temperature measured by the temperature sensor 15 and actual temperature of the memory chip 21 in advance. According to the first embodiment, such a process can be omitted (e.g. in the vicinity of the upper limit value of the guaranteed range of operation temperature), since it is possible to acquire a measured temperature that indicates a more accurate temperature of the memory chip 21.

The memory controller 10 may acquire temperature measured by the temperature sensor 201 by transmitting a temperature acquisition command to the memory chip 21. That is, the memory chip 21 transmits the measured temperature to the memory controller 10 according to the temperature acquisition command.

In the description above, the memory controller 10 reduces the performance in a step wise manner as the measured temperature approaches the upper limit value of the guaranteed range of operation temperature. The performance control method is not limited to the description above. For example, the memory controller 10 may control the upper limit value of the data transfer rate based on a difference between the value corresponding to the upper limit value of the guaranteed range of operation temperature and the measured temperature. As a control method based on the difference, any control method such as P control, PI control, PID control, or the like may be adopted.

In addition, in the description above, the memory controller 10 controls the data transfer rate. The performance targeted to be controlled is not limited to the data transfer rate. The memory controller 10 may control any process or operation corresponding to the amount of heat generation of the memory chip 21 as the performance to be controlled.

In addition, in the description above, it is assumed that the temperature sensor 15 is provided in the memory controller 10. The temperature sensor 15 may be provided outside the memory controller, at a position separated from the memory chip 21, and may be connected to the memory controller 10 by a dedicated signal line.

Second Embodiment

In S103, the CPU 11 may acquire the measured temperature from all of the memory chips 21. However, acquiring the measured temperature from all the memory chips 21 takes a long time to perform the processing of S103.

According to the second embodiment, the CPU 11 reduces the number of targets for acquiring the measured temperature to less than 16 instead of taking all the 16 memory chips 21 as the targets for acquiring the measured temperature. In this way, the time required for acquiring the measured temperature can be reduced. Hereinafter, some methods of reducing the number of targets for acquiring the measured temperature will be described.

Figure 5:
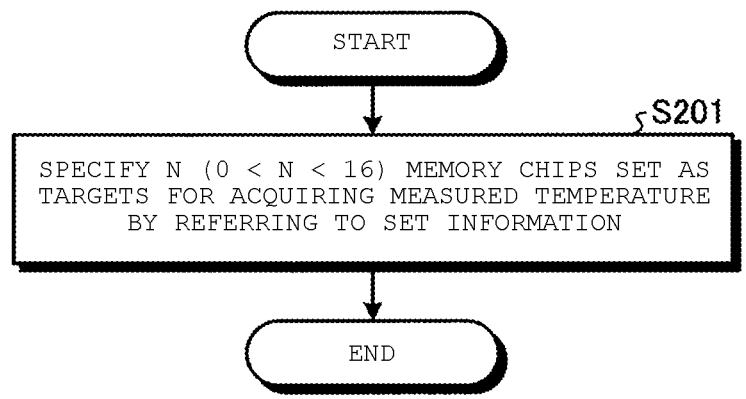
FIG. 5 is a flowchart illustrating an example of a method of reducing the number of targets for acquiring a measured temperature according to a second embodiment.

FIG. 5 is a flowchart illustrating an example of the method of reducing the number of targets for acquiring the measured temperature according to the second embodiment.

In the example illustrated in FIG. 5, less than all of the memory chips 21 of the NAND memory 20 (e.g. N (0<N<16) memory chips 21) are determined by a manufacturer as the targets for acquiring the measured temperature in advance, and identification information of the N memory chips 21 is recorded in set information. The set information is stored in a predetermined non-volatile storage area. The storage area is, for example, a NAND memory 20.

A method of determining the target for acquiring the measured temperature by the manufacturer is not limited to a particular method. As an example, by performing experiments or calculations, N memory chips 21 may be specified in order from the memory chip 21 that are likely to have a high temperature among the 16 memory chips 21, and then, the specified N memory chips 21 may be determined as a target for acquiring the measured temperature.

The CPU 11 specifies a target for acquiring the measured temperature based on the set information before starting the temperature control (S201). Then, the operation of reducing the number of targets for acquiring the measured temperature ends.

In this way, some of the 16 memory chips 21 are set in advance as the target for acquiring the measured temperature. The target for acquiring the measured temperature may thus be fixed. With this method, it is possible to reduce the number of targets for acquiring the measured temperature.

Figure 6:
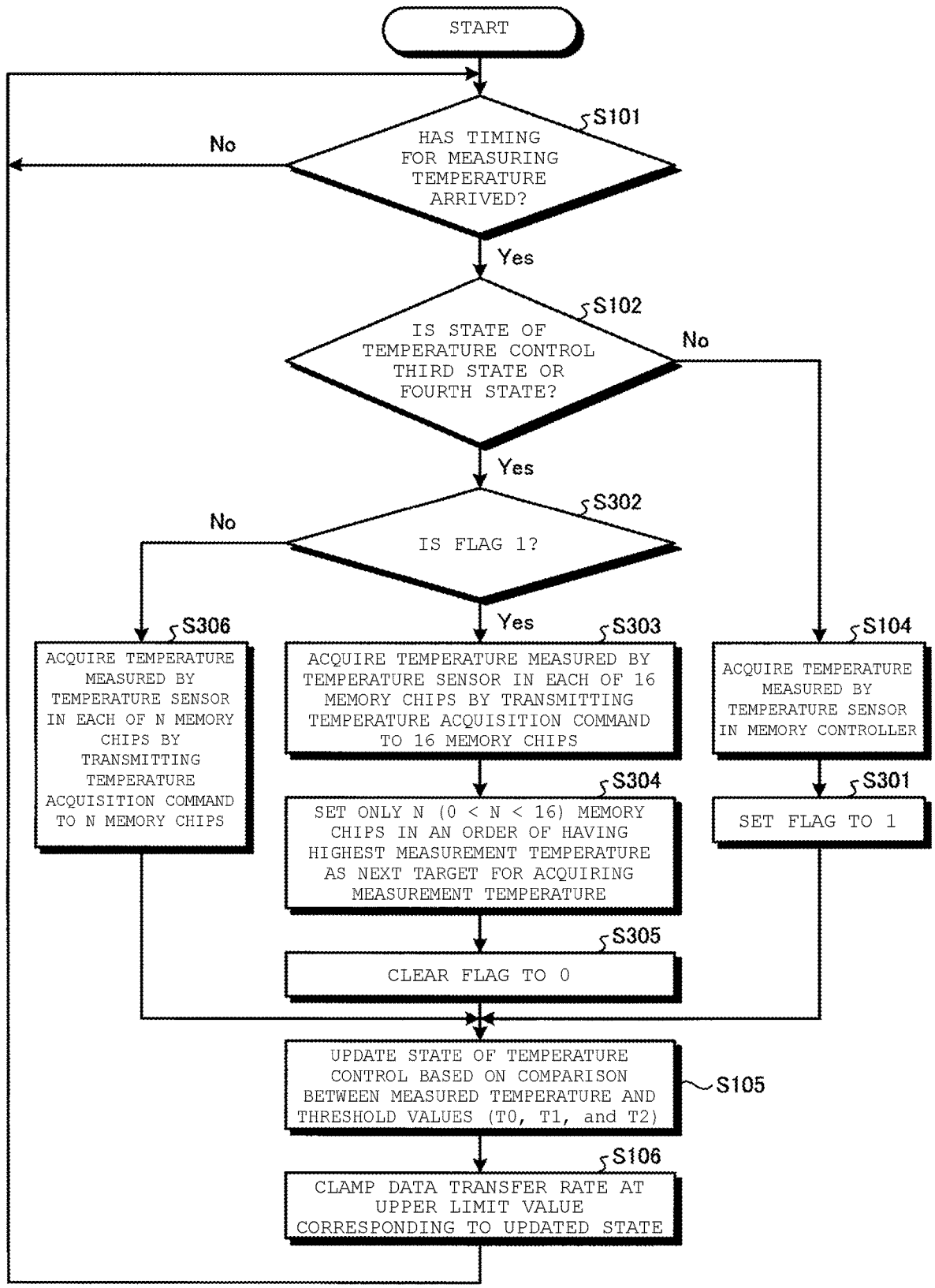
FIG. 6 is a flowchart illustrating another example of the method of reducing the number of targets for acquiring the measured temperature according to the second embodiment.

FIG. 6 is a flowchart illustrating another example of the method of reducing the number of targets for acquiring the measured temperature according to the second embodiment. In the figure, the same reference numerals is given to processing similar to the processing described in FIG. 4.

First, the CPU 11 determines whether or not a timing for measuring the temperature has arrived (S101). If the timing for measuring the temperature has not arrived (No in S101), the determination processing S101 is performed again. If the timing for measuring the temperature has arrived (Yes in S101), the CPU 11 determines whether or not the current state of temperature control is the third state or the fourth state (S102).

When the current state is the first state or the second state (No in S102), the CPU 11 acquires the temperature measured by the temperature sensor 15 in the memory controller 10 (S104). Then, the CPU 11 sets a predetermined flag to 1 (S301). This flag is to be used for the control of reducing the number of targets for acquiring the measured temperature.

Subsequent to S301, the CPU 11 updates the state of temperature control based on the comparison between the measured temperature and the threshold values (T0, T1, and T2) (S105). Then, the CPU 11 clamps the data transfer rate at the upper limit value corresponding to the current state (S106). Then, the processing S101 is performed again.

When the current state is the third state or the fourth state (Yes in S102), the CPU 11 determines whether or not the flag is 1 (S302). If the flag is 1 (Yes in S302), the CPU 11 acquires the temperature measured by the temperature sensor 201 of all the memory chips 21, that is, 16 memory chips 21 (S303). In S303, the CPU 11 causes each of the 16 memory chips 21 to output the temperature measured by the temperature sensor 201 by transmitting the temperature acquisition command to the 16 memory chips 21 via the NAND controller 14.

Subsequent to S303, the CPU 11 sets only N (0<N<16) memory chips 21 in an order of having the highest measured temperature as the next target for acquiring the measured temperature (S304). Then, the CPU 11 clears the flag to 0 (S305). After the processing S305, the processing S105 is performed.

Any method of handling the measured temperature obtained from a plurality of memory chips 21 in the processing S105 may be used. For example, the maximum value of the measured temperature obtained from the plurality of memory chips 21 is compared with the threshold values (T0, T1, and T2).

If the flag is 0 (No in S302), the CPU 11 acquires the temperature measured by the temperature sensor 201 of the N memory chips 21 set as the targets for acquiring the measured temperature in the processing S304 (S306). Thereafter, the processing S105 is performed.

As described above, the CPU 11 may acquire the measured temperature from all the 16 memory chips 21 and may set a part of the 16 memory chips 21 as the next targets for acquiring the measured temperature based on the acquired measured temperature. In this way, it is possible to reduce the number of targets for acquiring the measured temperature.

The timing for reducing the targets for acquiring the measured temperature is not limited to the timing described above. The CPU 11 may perform the processing at any timing, for acquiring the measured temperature from all 16 memory chips 21, and setting some of the 16 memory chips 21 as the next targets for acquiring the measured temperature based on the acquired measured temperature. For example, the CPU 11 may perform the processing at the timing independent of the state of temperature control. The CPU 11 may perform the processing at a predetermined time interval.

In the example in FIG. 6, if the state returns to the first state or the second state after reducing the number of targets for acquiring the measured temperature, the CPU 11 resets the setting of targets for acquiring the measured temperature to 16 memory chips 21. The timing for resetting the setting of the targets for acquiring the measured temperature to the 16 memory chips 21 is not limited to above. In addition, the CPU 11 may be configured not to change the targets for acquiring the measured temperature after the number of targets for acquiring the measured temperature is reduced.

Figure 7:
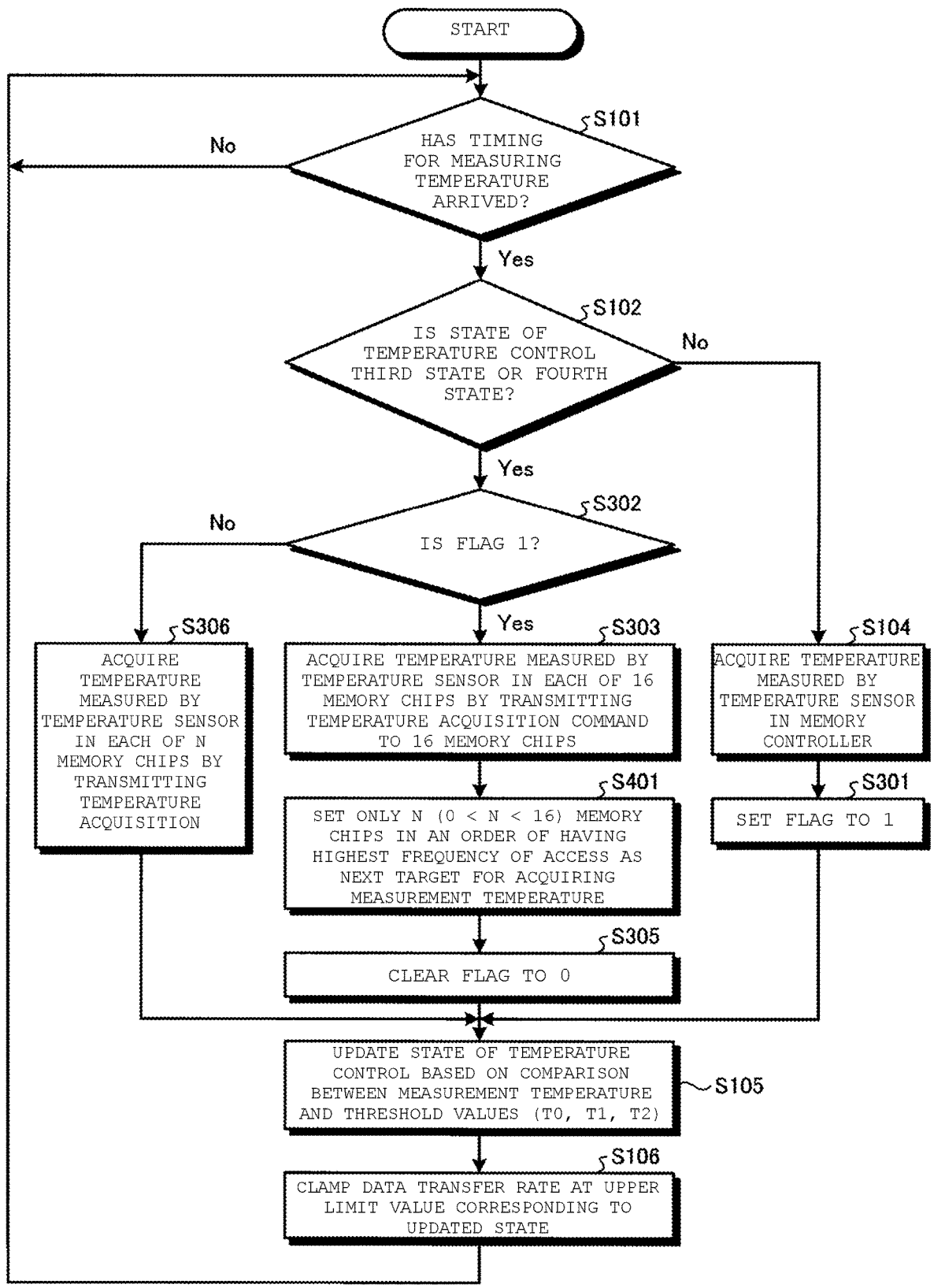
FIG. 7 is a flowchart illustrating still another example of the method of reducing the number of targets for acquiring the measured temperature according to the second embodiment.

FIG. 7 is a flowchart illustrating still another example of the method of reducing the number of targets for acquiring the measured temperature according to the second embodiment.

The amount of heat generation of the memory chip 21 corresponds to the frequency of access. As the frequency of access to the memory chip 21 increases, the temperature of the memory chip 21 increases. In the example in FIG. 7, the CPU 11 selects the targets for acquiring the measured temperature according to the frequency of access.

A method of acquiring the frequency of access is not limited to a specific method. For example, the CPU 11 counts the number of times of performing data writing, data reading, and/or data erasing for each memory chip 21. The CPU 11 may count the number of times of performing the data writing, or may count the number of times of performing the data reading. The CPU 11 may count the number of times of performing the data erasing. The CPU 11 may use the number of times obtained by counting as the frequency of access of each memory chip 21. The CPU 11 may use the number of times obtained by counting to calculate the frequency of access of each memory chip 21.

A series of processing items illustrated in FIG. 7 is different from the series of processing items illustrated in FIG. 6 in a point that S401 is provided instead of S304. Here, only S401 will be described.

In S401, the CPU 11 sets N memory chips 21 in an order of having the highest frequency of access among the 16 memory chips 21, as the next target for acquiring the measured temperature. N may be a number less than 16.

As described above, the CPU 11 may set some of the 16 memory chips 21 as the targets for acquiring the measured temperature based on the frequency of access. By preferentially setting memory chips 21 having high frequency of access as targets for acquiring the measured temperature, the targets for acquiring the measured temperature may be limited to the memory chips 21 of which the temperature is expected to be high.

As in the case in FIG. 6, the timing for reducing the targets for acquiring the measured temperature is not limited to the timing described above. The timing for resetting the setting of targets for acquiring the measured temperature to the 16 memory chips 21 is not limited to the timing at which the state of temperature control transitions from the third state or fourth state to the first state or second state. The CPU 11 may be configured not to change the targets for acquiring the measured temperature after the number of targets for acquiring the measured temperature is reduced.

Figure 8:
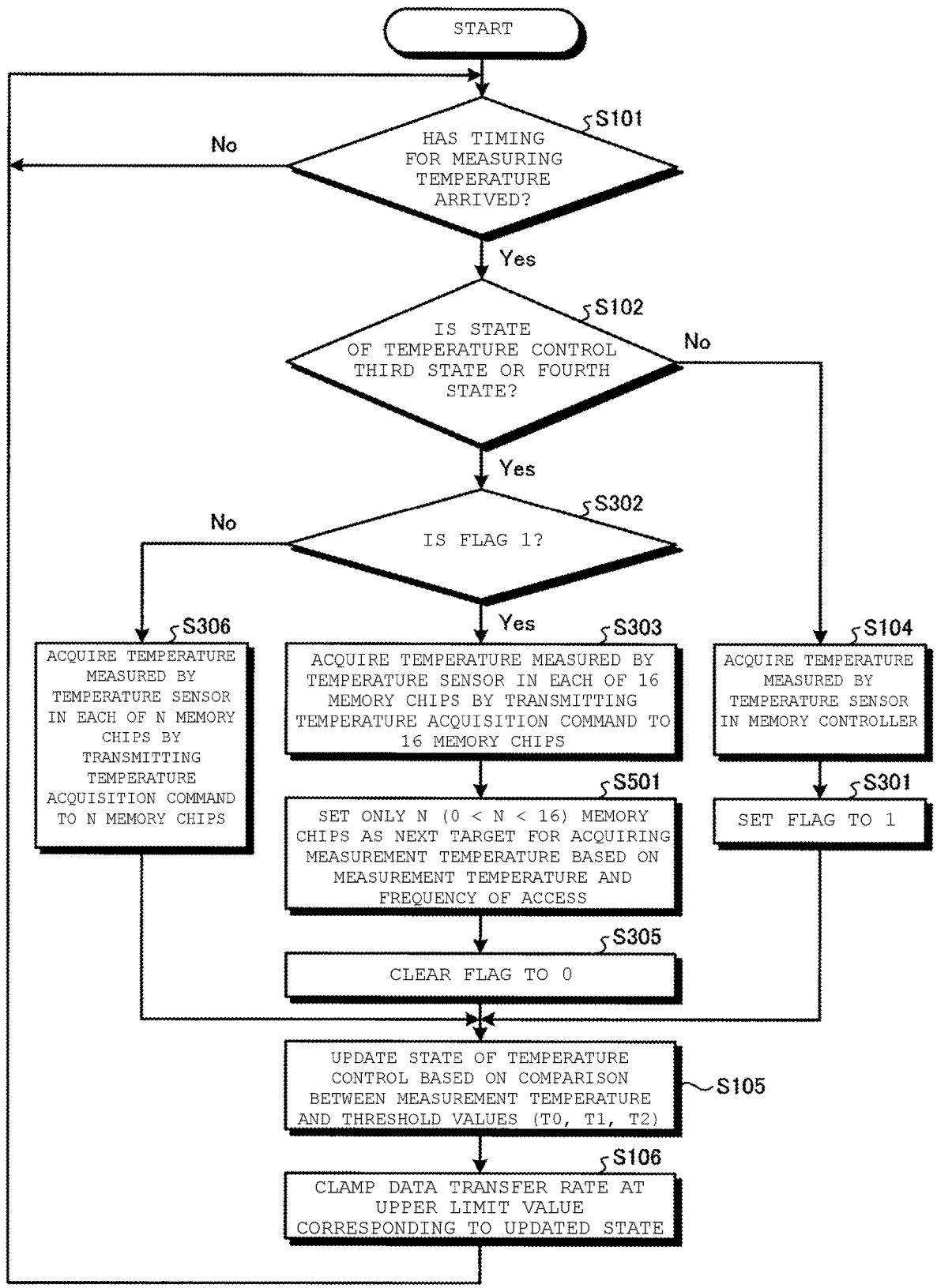
FIG. 8 is a flowchart illustrating still another example of the method of reducing the number of targets for acquiring the measured temperature according to the second embodiment.

FIG. 8 is a flowchart illustrating still another example of the method of reducing the number of targets for acquiring the measured temperature according to the second embodiment. A series of processing items illustrated in this flowchart is different from the series of processing items illustrated in FIG. 6 in a point that S501 is provided instead of S304. Here, only S501 will be described.

In S501, the CPU 11 sets only N memory chips as the targets for acquiring the measured temperature based on the measured temperature and the frequency of access.

For example, assuming that the measured temperature and the frequency of access of the memory chip 21 whose identification number is i are Tdet_i and F_i, respectively, the CPU 11 calculates an evaluation value E_i of the memory chip 21 whose identification number is i using following equation (1).

$$E\_i = w1 * Tdet\_i + w2 * F\_i \quad (1)$$

Here, w1 and w2 are weighting coefficients. w1 and w2 are, for example, positive integers.

The CPU 11 calculates the evaluation values E for each of the 16 memory chips 21. Then, only N memory chips 21 in an order of having the largest evaluation value E are selected as the next targets for acquiring the measured temperature.

A method calculating the evaluation value E is not limited to the above. The evaluation value E may be calculated using any function that includes the measured temperature and the frequency of access as variables.

In addition, a method of selecting the targets for acquiring the measured temperature using the evaluation value E is not limited to the above. For example, if a function in which the evaluation value E decreases as the measured temperature increases and the evaluation value E decreases as the frequency of access increases is used as a function for calculating the evaluation value E, the CPU 11 may select only N memory chips 21 in an order of having the smallest evaluation value E as the targets for acquiring the measured temperature.

As described above, the CPU 11 may set some of the 16 memory chips 21 as the targets for acquiring the measured temperature based on the measured temperature and the frequency of access.

Similarly to the case in FIG. 6, a timing for reducing the number of targets for acquiring the measured temperature is not limited to the timing described above. In addition, the CPU 11 may be configured not to change the number of targets for acquiring the measured temperature after the number of targets for acquiring the measured temperature is reduced.

As described above, according to the second embodiment, the memory controller 10 selects some of the 16 memory chips 21 as the targets for acquiring the measured temperature. In this way, it is possible to reduce a time required for acquiring the measured temperature compared to the case of using all the 16 memory chips 21 as the targets for acquiring the measured temperature.

Only a certain technology according to the second embodiment may be applied to the memory system. For example, the memory controller 10 may control the performance using a single temperature sensor provided in the memory chip 21. The memory controller 10 may select some of the 16 memory chips 21 as the targets for acquiring the measured temperature based on the set information, the measured temperature, the frequency of access, or a combination of the measured temperature and the frequency of access, and the like. In this way, it is possible to reduce a time required for obtaining the measured temperature. In addition, it becomes possible to eliminate the temperature sensor 15 from the memory controller 10.

As used herein, the term "approximately" is used to describe and account for small variations. When used in conjunction with an event or circumstance, the term "approximately" can refer to instances in which the event or circumstance occurs precisely as well as instances in which the event or circumstance occurs to a close approximation. For example, when used in conjunction with a numerical value, the term "approximately" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The different embodiments or features described herein, or portions thereof, may be combined. The accompanying claims and their equivalents are intended to cover such forms or modifications as would fall within the scope and spirit of the present disclosure.

What is claimed is:

1. A memory system comprising:
   a first memory chip that includes a first temperature sensor; and
   a memory controller that includes a second temperature sensor, the memory controller configured to:
   perform, at a first timing, a first temperature acquisition process that includes acquiring a first measured temperature using the first temperature sensor or the second temperature sensor;

select one of the first temperature sensor and the second temperature sensor for a second temperature acquisition process based the first measured temperature;
perform, at a second timing later than the first timing, the second temperature acquisition process comprising acquiring a second measured temperature using the selected one of the first temperature sensor or the second temperature sensor;
select the first temperature sensor for the second temperature acquisition process when the first measured temperature is higher than a first threshold value, and select the second temperature sensor for the second temperature acquisition process when the first measured temperature is lower than the first threshold value; and
set the performance of the memory system to a first performance level when the second measured temperature is lower than a second threshold value, and set the performance of the memory system to a second performance level lower than the first performance level when the second measured temperature is higher than the second threshold value,
wherein the second threshold value is greater than the first threshold value.

2. The memory system according to claim 1,
wherein the second threshold value corresponds to an upper limit value of a guaranteed range of an operation temperature of the first memory chip.

3. The memory system according to claim 1, wherein the memory controller is further configured to transmit a command to the first memory chip requesting the second measured temperature, and
the first memory chip is configured to transmit the second measured temperature to the memory controller in response to the command.

4. The memory system according to claim 3, further comprising:
a plurality of memory chips including the first memory chip,
wherein the memory controller is configured to select one or more memory chip from among the plurality of memory chips, and transmit the command only to the one or more selected memory chips of the plurality of memory chips in the second temperature acquisition process.

5. The memory system according to claim 4,
wherein the memory controller is configured to select a predetermined memory chip from among the plurality of memory chips.

6. The memory system according to claim 4,
wherein each of the plurality of memory chips has a respective temperature sensor, and the memory controller is configured to acquire a respective third measured temperature from each of the temperature sensors of the plurality of memory chips, and to select the memory chip from among the plurality of memory chips based on the third measured temperatures.

7. The memory system according to claim 6,
wherein the memory controller is configured to select the memory chip from among the plurality of memory chips further based on a respective frequency of access to each of the plurality of memory chips.

8. A memory system comprising:
a plurality of memory chips each of which includes a respective first temperature sensor; and
a memory controller configured to:
select a memory chip from among the plurality of memory chips for a first temperature acquisition process;
transmit a command to the selected memory chip of the plurality of memory chips to acquire a temperature measured by the first temperature sensor of the selected memory chip as part of the first temperature acquisition process;
receive a response to the command including the temperature measured by the first temperature sensor of the selected memory chip as part of the first temperature acquisition process;
control a performance of the memory system based on the first temperature included in the response to the command;
perform a second temperature acquisition process prior to performing the first temperature acquisition process, the second temperature acquisition process including acquiring a respective temperature of each of the plurality of memory chips; and
select the memory chip from among the plurality of memory chips based on the acquired temperatures of the plurality of memory chips.

9. The memory system according to claim 8, wherein the memory controller is configured to select only one memory chip from among the plurality of memory chips in the first temperature acquisition process.

10. The memory system according to claim 8,
wherein the memory controller is configured to select a predetermined memory chip from among the plurality of memory chips.

11. The memory system according to claim 8,
wherein the memory controller is further configured to acquire a respective frequency of access to each of the plurality of memory chips, and select the memory chip from among the plurality of memory chips further based on the respective frequency of access to each of the plurality of memory chips.

12. A memory system comprising:
a plurality of memory chips each of which includes a respective first temperature sensor; and
a memory controller configured to:
select a memory chip from among the plurality of memory chips for a first temperature acquisition process;
transmit a command to the selected memory chip of the plurality of memory chips to acquire a temperature measured by the first temperature sensor of the selected memory chip as part of the first temperature acquisition process;
receive a response to the command including the temperature measured by the first temperature sensor of the selected memory chip as part of the first temperature acquisition process;
control a performance of the memory system based on the first temperature included in the response to the command; and
acquire a respective frequency of access to each of the plurality of memory chips, and select the memory chip from among the plurality of memory chips based on the respective frequency of access to each of the plurality of memory chips.

13. The memory system according to claim 12, wherein the memory controller is configured to select only one memory chip from among the plurality of memory chips in the first temperature acquisition process.

14. The memory system according to claim 12,
wherein the memory controller is configured to select a predetermined memory chip from among the plurality of memory chips.

15. The memory system according to claim 12, wherein the memory controller is further configured to:
perform a second temperature acquisition process prior to performing the first temperature acquisition process, the second temperature acquisition process including acquiring a respective temperature of each of the plurality of memory chips, and
select the memory chip from among the plurality of memory chips based on the acquired temperatures of the plurality of memory chips.

* * * * *